US006664901B1

(12) United States Patent
Yamada et al.

(10) Patent No.: US 6,664,901 B1
(45) Date of Patent: Dec. 16, 2003

(54) KEYBOARD INPUT DEVICE

(75) Inventors: Naoki Yamada, Fukushima-ken (JP); Satoru Takemori, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/506,869

(22) Filed: Feb. 15, 2000

(30) Foreign Application Priority Data

Feb. 22, 1999 (JP) .......................................... 11-043213

(51) Int. Cl.[7] ......................... H03K 17/94; H03K 11/00
(52) U.S. Cl. ....................... 341/22; 200/302.1; 200/515
(58) Field of Search ......................... 341/22; 200/302.1, 200/302.2, 512, 511, 515, 517

(56) References Cited

U.S. PATENT DOCUMENTS 3,898,421 A * 8/1975 Suzumura ................... 200/515
4,485,279 A * 11/1984 Nakamura .................. 200/5 A
4,596,912 A * 6/1986 Hattori .................... 200/302.2
5,874,700 A * 2/1999 Hochgesang ................ 200/515

FOREIGN PATENT DOCUMENTS

JP A1 2776130 5/1998

* cited by examiner

*Primary Examiner*—Timothy Edwards
(74) *Attorney, Agent, or Firm*—Brinks Hofer Gilson & Lione

(57) ABSTRACT

A keyboard input device includes an elastic spring member bonded to a overcoat provided on a film substrate by an adhesive so that a movable contact part provided in the elastic spring member is disposed over a pair of fixed contact parts provided on the film substrate. An air-passage hole is provided on the ceiling of the elastic spring member including the movable contact part, the air-passage hole being disposed in the vertical moving direction of the movable contact part. Grooves are provided in a key-top at a portion thereof to be in contact with the top of the elastic spring member, the air-passage grooves being formed in a direction perpendicular to the axis of the air-passage hole to communicate with the air-passage hole. The air in the hollow elastic spring member is discharged, when the key-top is pressed to deform the elastic spring member, to the outside of the elastic spring member through the air-passage hole and the air-passage grooves.

3 Claims, 4 Drawing Sheets

KEYBOARD INPUT DEVICE

BACKGROUND OF THE INVENTION

1. Field of the Invention

The present invention relates to low-profile keyboard input devices preferably used in notebook personal computers and the like.

2. Description of the Related Art

Hitherto, personal computers such as notebook computers to be used as portable terminal devices have been improved regarding miniaturization and weight-reduction.

A typical configuration of a keyboard input device used in such a notebook personal computer is described below with reference to FIG. 8.

A metallic plate 21 is provided with a film substrate 22. The film substrate 22 is provided thereon with a plurality of conducting patterns 23, which are electrically conductive, each conducting pattern 23 having a pair of fixed contact parts 23*a* and 23*b*. The fixed contact parts 23*a* and 23*b* are disposed opposing each other across a gap 23*c* therebetween.

A plurality of hollow domed elastic spring members 24 of an elastically-deformable material such as rubber are provided covering the fixed contact parts 23*a* and 23*b*. Each elastic spring member 24 includes a mounting flange 24*a* formed at the bottom thereof. A plurality of air-passage grooves 24*b* having predetermined width and depth are formed at the bottom of the mounting flange 24*a* opposing the film substrate 22 and the conducting pattern 23.

The elastic spring members 24 are bonded by an adhesive 25 to the film substrate 22 including the conducting patterns 23.

Each of the hollow elastic spring members 24 is provided with a protrusion 24*c* downwardly protruding from the inner top thereof. The protrusion 24*c* includes a movable conductive-contact part 24*d* formed at the end thereof.

Each of the domed elastic spring members 24 is provided with a key-receiving part 24*e* upwardly protruding from the outer top thereof.

The key-receiving part 24*e* receives a key-top 26 brought into contact therewith at the inner surface 26*a* of the key-top 26. The key-top 26 moves vertically while supported by a lifting mechanism (not shown) mounted on the metallic plate 21.

Mounting holes (not shown) are formed in the metallic plate 21 for mounting the lifting mechanism (not shown). The metallic plate 21 is provided with a sealing sheet 27 for sealing the mounting holes, laminated on the bottom surface of the metallic plate 21.

A known keyboard thus arranged operates in a manner such that air in the hollow elastic spring members 24 is discharged by the deformation of the hollow domed elastic spring members 24 pressed by the key-tops 26 through the air-passage grooves 24*b* provided at the mounting flanges 24*a*, whereby the key-tops 26 can smoothly move vertically with a light touch, thereby providing superior feeling in the key operation.

By pressing each key-top 26, the movable contact part 24*d* comes in contact with the fixed contact parts 23*a* and 23*b*, whereby the pair of the fixed contact parts 23*a* and 23*b* are electrically connected to each other through the movable contact part 24*d*.

Such known keyboard devices are mounted in notebook personal computers used as portable terminal devices. At present, the notebook personal computers are often used outdoors even in wet weather, therefore, the need for waterproof keyboard devices is increasing.

However, the known keyboard device has a problem when used outdoors in wet weather in that there is a risk of discoloration and corrosion of the fixed contact parts 23*a* and 23*b* by water droplets adhering on the film substrate 22 and the conducting patterns 23 penetrating into the hollow elastic spring members 24 through the air-passage grooves 24*b* of the mounting flanges 24*a*. The problem is that there is a risk of defective conduction between the pair of the fixed contact parts 23*a* and 23*b* and the movable contact part 24*b* in contact therewith, which is caused by the discoloration or corrosion of the fixed contact parts 23*a* and 23*b*. Also, there is a risk of disconnection of the conducting patterns 23 by corrosion when water droplets remain on the conducting patterns 23, a portion of which is disposed at the outside of the elastic spring members 24.

SUMMARY OF THE INVENTION

Accordingly, it is an object of the present invention to provide a waterproof keyboard device in which water droplets of rain or the like are prevented from penetrating into elastic spring members when the keyboard device is used outdoors in wet weather.

In accordance with an aspect of the present invention, a keyboard input device is provided which comprises a flexible film substrate; a conducting pattern provided on the film substrate, including a pair of fixed contact parts opposing each other; a hollow domed elastic spring member including a movable contact part provided on the ceiling thereof, the movable contact part being vertically movable; and a key-top for pressing the top of the elastic spring member. The elastic spring member is mounted on the film substrate so that the movable contact part is disposed over the pair of the fixed contact parts. An air-passage hole is provided in the ceiling having the movable contact part, the air-passage hole being formed in the vertically moving direction of the movable contact part. Also, air-passage grooves communicating with the air-passage hole are formed in a direction perpendicular to the axis of the air-passage hole, the air-passage grooves being provided at least in one of the positions in the key-top at a portion thereof to be in contact with the top of the elastic spring member and in the elastic spring member at the top thereof. With this arrangement, the air in the hollow elastic spring member is discharged, when the key-top is pressed to deform the elastic spring member, to the outside of the elastic spring member through the air-passage hole and the air-passage grooves.

The keyboard input device according to the present invention may be provided with an insulating overcoat, which is moisture-resistant and water-repellent, disposed on the film substrate including the conducting pattern with the pair of the fixed contact parts being exposed, and may be provided with the elastic spring member bonded to the overcoat by an adhesive.

In the keyboard input device according to the invention, the film substrate may be provided with a hole between the pair of the fixed contact parts which oppose each other across the hole therebetween.

According to another aspect of the present invention, a keyboard input device is provided which comprises a metallic plate; a flexible film substrate disposed on the metallic plate; a conducting pattern including a pair of fixed contact parts formed thereon opposing each other; a hollow domed elastic spring member including a movable contact part provided on the ceiling thereof, the movable contact part being vertically movable; and a key-top for depressing the top of the elastic spring member. A first hole is formed in the film substrate in the vicinity of the fixed contact parts, and an air-passage hole is formed in the metallic plate at a position in which the first hole is disposed, in the moving direction of the movable contact part. With this arrangement, the air in the hollow elastic spring member is discharged, when the key-top is pressed to deform the elastic spring member, to the lower part of the metallic plate through the first hole and the air-passage hole.

The keyboard input device according to the invention may be provided with an insulating overcoat, which is moisture-resistant and water-repellent, disposed on the film substrate including the conducting pattern with the pair of the fixed contact parts being exposed, and the elastic spring member is bonded to the overcoat by an adhesive.

In the keyboard input device according to the invention, the first hole in the film substrate may be disposed in a position flanked by the pair of the fixed contact parts.

In the keyboard input device according to the invention, the film substrate may be bonded to the metallic plate, and the first hole and the air-passage hole may be formed by punching in one operation.

DESCRIPTION OF THE PREFERRED EMBODIMENTS

Embodiments of a keyboard input device according to the present invention are described as follows with reference to the drawings.

Figure 1:
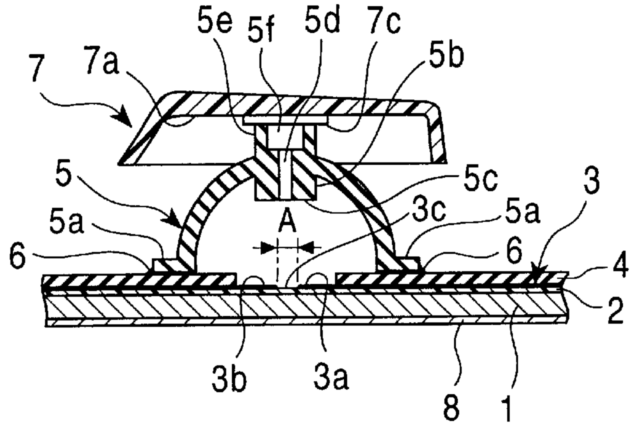
FIG. 1 is a cross-sectional view of a critical portion of a keyboard input device according to a first embodiment of the present invention.
Figure 2:
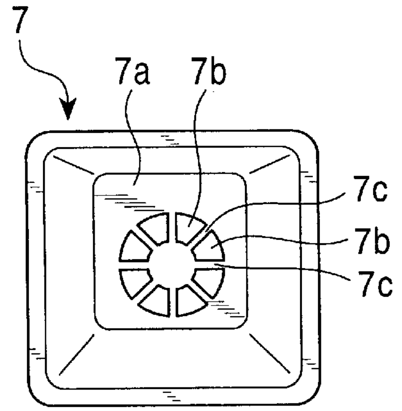
FIG. 2 is a bottom view of a key-top of the keyboard input device according to the first embodiment of the invention.
Figure 3:
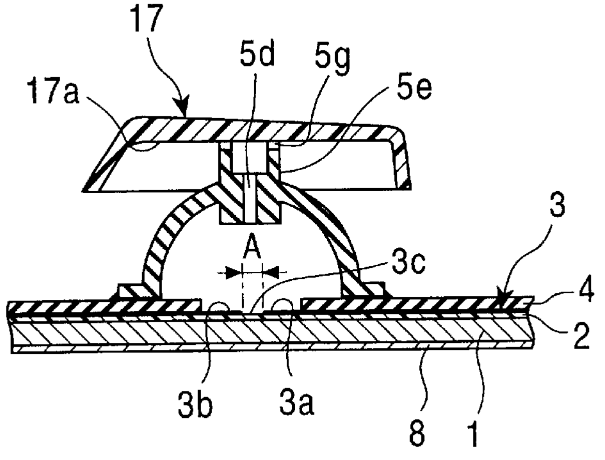
FIG. 3 is a cross-sectional view of a critical portion of a modified example of the keyboard input device according to the first embodiment of the invention.
Figure 4:
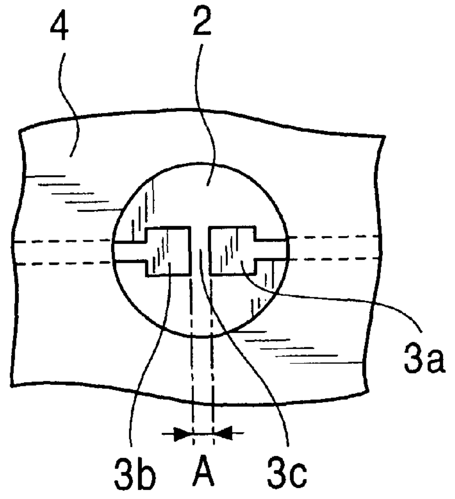
FIG. 4 is an expanded plan view of a critical portion of a fixed contact part of the keyboard input device according to the present invention.
Figure 6:
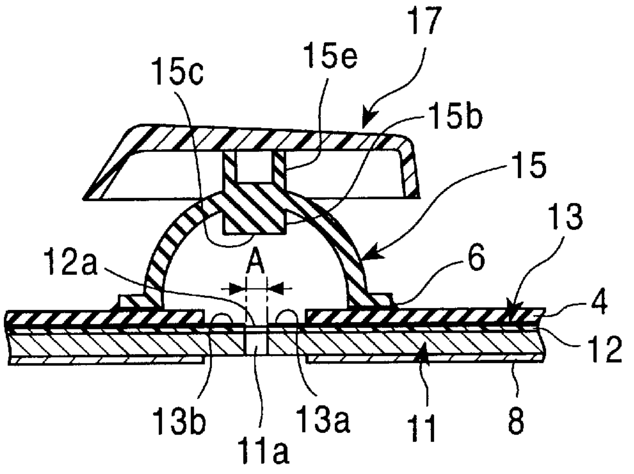
FIG. 6 is a cross-sectional view of a critical portion of the keyboard-type input device according to a second embodiment of the present invention.
Figure 7:
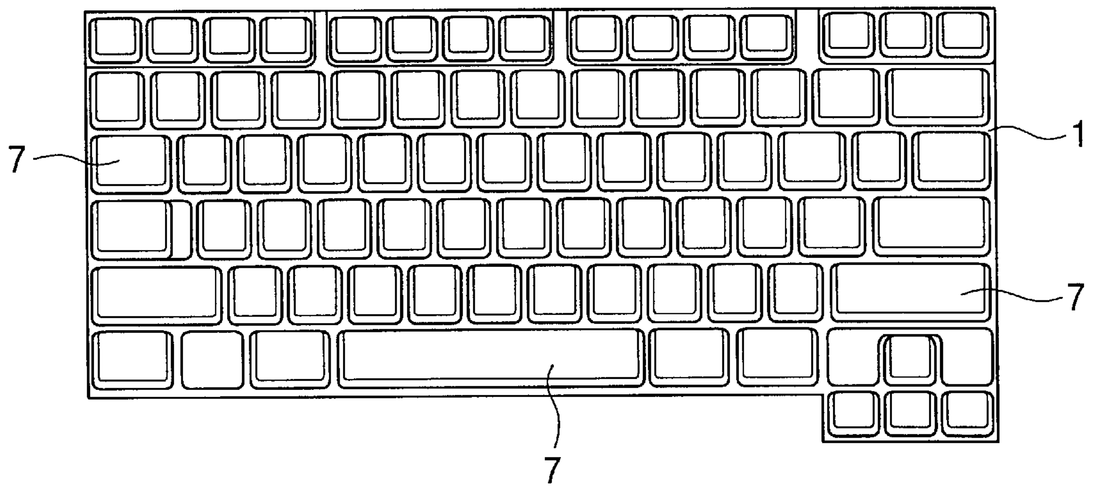
FIG. 7 is a plan view of the keyboard input device according to the present invention.
Figure 8:
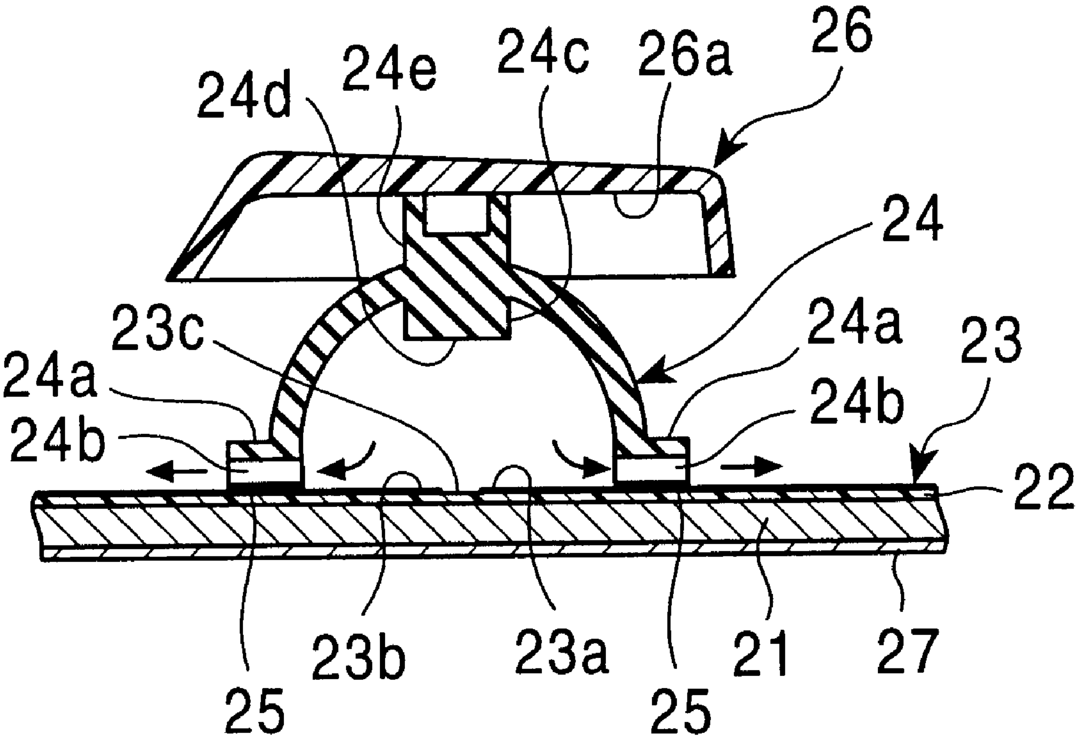
FIG. 8 PRIOR ART
FIG. 8 is a cross-sectional view of a critical portion of a known keyboard input device.

FIG. 1 is a cross-sectional view of a critical portion of a keyboard input device according to a first embodiment of the present invention. FIG. 2 is a bottom view of a key-top of the keyboard input device according to the first embodiment. FIG. 3 is a cross-sectional view of a critical portion of a modified example of the keyboard input device according to the first embodiment. FIGS. 4 and 5 are expanded plan views of critical portions of a conducting pattern of the keyboard input device according to the present invention. FIG. 6 is a cross-sectional view of a critical portion of the keyboard input device according to a second embodiment of the present invention. FIG. 7 is a plan view of the keyboard input device according to the present invention.

In conjunction with FIGS. 1 to 5, the first embodiment of the keyboard input device according to the invention is described below. As shown in FIG. 1, the keyboard input device according to the first embodiment of the invention includes a metallic plate 1 of a metallic material such as an aluminum plate at the lower part thereof. The metallic plate 1 is laminated thereon with a film substrate 2 of a flexible film such as a polyethylene terephthalate film.

The film substrate 2 is provided thereon with a plurality of conductive conducting-patterns 3, for example, of a carbon resin formed by printing or the like. Each of the conducting patterns 3 includes a pair of fixed contact parts 3*a* and 3*b* opposing each other across a gap 3*c* therebetween at a distance A (a size of the gap 3*c*), as shown in FIG. 4.

The gap 3*c* is formed with a distance A which is less than the overall size of a movable contact part 5*d* of an elastic spring member 5 which is described below.

The film substrate 2 including the conducting patterns 3 is provided with an insulating overcoat 4 which is moisture-resistant and water-repellent and having a predetermined thickness, the overcoat 4 being laminated on the film substrate 2 with the pair of the fixed contact parts 3*a* and 3*b* being exposed.

The overcoat 4 is provided thereon with hollow domed elastic spring members 5 which are made of rubber, etc., so as to be elastically deformable. Each of the elastic spring members 5 includes an annular mounting flange 5*a* formed at the lower part thereof.

Each hollow domed elastic spring member 5 is provided with a protrusion 5*b* on the ceiling thereof. The protrusion 5*b* includes a conductive movable-contact part 5*c* of a material such as a carbon resin coherent with a planar end of the protrusion 5*b*. The movable contact part 5*c* is vertically movable by the deformation of the elastic spring member 5.

The protrusion 5*b* on the ceiling includes an air-passage hole 5*d* passing through the protrusion 5*b* in the vertical moving direction of the movable contact part 5*c*. The elastic spring member 5 is provided with a key-receiving part 5*e* protruding from the top of the elastic spring member 5. The key-receiving part 5*e* is provided with a spot-facing part 5*f* formed with a predetermined depth, the spot-facing part 5*f* communicating with the air-passage hole 5*d*.

The elastic spring members 5 thus arranged are bonded to the overcoat 4 at each mounting flange 5*a* by an adhesive 6.

The key-receiving part 5*e* of the elastic spring member 5 receives an inner face 7*a* of a substantially rectangular key-top 7 in contact therewith. The key-top 7 includes ribs 7*b* of a predetermined height at a part in contact with the key-receiving part 5*e* provided at the top of the elastic spring member 5. Air-passage grooves 7*c* are formed between each rib 7*b*. The air-passage grooves 7*c* having a predetermined width are formed in radial directions perpendicular to the axis of the air-passage hole 5*d*, the air-passage grooves 7*c* communicating with the air-passage hole 5*d*.

The key-top 7 is vertically movable by being supported by a lifting mechanism (not shown) mounted on the metallic plate 1.

The metallic plate 1 is provided with mounting holes (not shown) for mounting the lifting mechanism (not shown) on the metallic plate 1. The metallic plate 1 includes a sealing sheet 8 for sealing the mounting holes, laminated on the lower face of the metallic plate 1.

The air in the elastic spring member 5 is discharged to the outside thereof through the air-passage hole 5*d* and the air-passage grooves 7c by downward deformation of the elastic spring member 5.

According to the first embodiment of the present invention, the ribs 7b are provided at the key-top 7 side, the ribs 7b including the air-passage grooves 7c therebetween. The inner face 17a of the key-top 17 may be formed planarly, and air-passage grooves 5g may be formed in the key-receiving part 5e provided at the top of the elastic spring member 5, as shown in FIG. 3, instead of the ribs 7b formed at the key-top 7 side, as described in the first embodiment.

That is, the keyboard input device according to the first embodiment of the present invention includes the air-passage hole 5d in the protrusion 5b on the ceiling of the elastic spring member 5 having the movable contact part 5c, the air-passage hole 5d being formed in the vertical moving direction of the movable contact part 5c, and includes the air-passage grooves 5g and/or 7c formed in a direction perpendicular to the axis of the air-passage hole 5d, the air-passage grooves 5g and/or 7c communicating with the air-passage hole 5d. The air-passage grooves 5g and/or 7c are formed in a part of the key-top 7 which comes into contact with the key-receiving part 5e provided at the top of the elastic spring member 5, and/or In the key-receiving part 5e provided at the top of the elastic spring member 5. With this arrangement, the air in the elastic spring member 5 is discharged to the outside thereof through the air-passage hole 5d and the air-passage grooves 5g and/or 7c, when the key-top 7 is pressed to deform the elastic spring member 5.

Figure 5A:
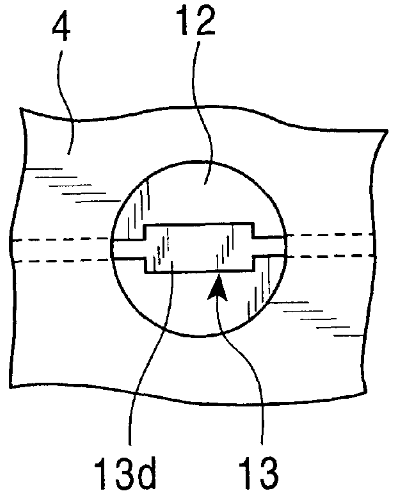
FIGS. 5A and 5B is an expanded plan view of a modified example of the fixed contact part of the keyboard input device according to the present invention.
Figure 5B:
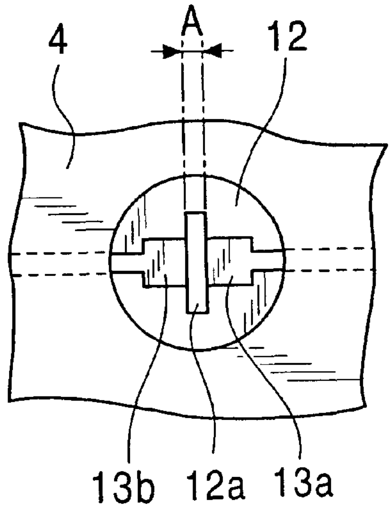

The keyboard input device according to the first embodiment of the,present invention may be modified as in an example shown in FIGS. 5A and 5B. In the modified example, as shown in FIG. 5A, a wide contact-forming part 13d is prepared by shaping a part of a conducting pattern 13. The contact-forming part 13d is punched at an intermediate part thereof by a tool such as a press to form a slit 12aas shown in FIG. 5B. The width of the slit 12a is the same amount A as that of the gap 3c, whereby a pair of fixed contact parts 13a and 13b are formed opposing each other across the slit 12a.

In the keyboard input device thus arranged, according to the first embodiment of the invention, the air in each of the elastic spring members 5 can be discharged to the outside thereof through the air-passage hole 5d and the air-passage grooves 7c provided at the key-top 7 side and/or the air-passage grooves 5g provided at the elastic spring member 5 side.

With the air being discharged, the key-top 7 is smoothly movable vertically with a light touch, thereby providing superior feeling in key operation. When the device is used outdoors in wet weather, water droplets are prevented from penetrating into the elastic spring members 5, thereby protecting the fixed contact parts 3a and 3b against discoloration and corrosion, the fixed contact parts 3a and 3b being separated from the outside by the elastic spring members 5.

The keyboard input device according to the present invention is mounted in a device such as a notebook personal computer, in which a plurality of the key-tops 7 are mounted to be aligned on a lifting mechanism (not shown) provided on the metallic plate 1, as shown in FIG. 7.

The keyboard input device according to a second embodiment of the present invention includes a metallic plate 11, as shown in FIG. 6, having the contact-forming part 13d of the conducting pattern 13, described in the first embodiment, provided with an air-passage hole 11a having substantially the same shape as that of the slit 12a and having the same width as the amount A, the air-passage hole 11a being formed by punching.

An elastic spring member 15 is provided with a movable contact part 15c vertically movable. An inner face 17a of a key-top 17 is formed in a planar fashion.

The slit 12a is formed in a film substrate 12 between a pair of fixed contact parts 13a and 13b. The metallic plate 11 is provided with the air-passage hole 11a passing therethrough in the moving direction of the movable contact part 15c, the air-passage hole 11a being disposed in the same position of the slit 12a. The air in the elastic spring member 15 is discharged, by pressing the key-top 17 to downwardly deform the elastic spring member 15, toward the bottom side of the metallic plate 11 through the slit 12a of the film substrate 12 and the air-passage hole 11a of the metallic plate 11.

A modified example of the second embodiment according to the invention is provided, in which the metallic plate 11 laminated with the film substrate 12 is provided with the slits 12a of the film substrate 12 and the air-passage holes 11a of the metallic plate 11 being formed by punching in one operation with a press or the like, whereby the slits 12a of the film substrate 12 and the air-passage holes 11a of the metallic plate 11 can be formed exactly in the same position.

The keyboard input device according to the present invention includes elastic spring members having movable contact parts being mounted on a film substrate having pairs of fixed contact parts so that the movable contact parts are positioned over each pair of the fixed contact parts. The ceiling of each elastic spring member including the movable contact part is provided with an air-passage hole passing in the vertical moving direction of the movable contact part. Air-passing grooves communicating with the air-passage hole are formed in a direction perpendicular to the axis of the air-passage hole, the air-passage grooves being disposed in a key-top at a part which comes into contact with the top of the elastic spring member and/or in the elastic spring member at the top thereof. When pressing the key-top to deform the elastic spring member, the air in the elastic spring member is discharged to the outside of the elastic spring member through the air-passage hole and the air-passage grooves. With this arrangement, a waterproof keyboard input device is provided in which water droplets are prevented from penetrating into the elastic spring members including the fixed contact parts when used outdoors in wet weather.

The film substrate having conducting patterns which include the contact parts is provided with an insulating overcoat, which is moisture-proof and water-repellent, disposed on the film substrate so that the fixed contact parts are exposed, and is provided with the elastic spring members bonded to the overcoat by an adhesive. With this arrangement, a portion of the conducting patterns disposed outside the elastic spring members can be protected by the overcoat, whereby the conducting patterns are prevented from corrosion caused by water droplets.

The film substrate is provided with a hole formed between each pair of the fixed contact parts, the pair of the fixed contact parts opposing each other across the hole therebetween, whereby the conducting patterns can be easily formed, and the opposing fixed contact parts can be reliably separated by the hole.

The film substrate is provided with the holes between each of the pairs of the fixed contact parts, and air-passage holes are provided in the metallic plate in the same positions as those of the holes formed in the film substrate laminated thereon, the air-passage holes being formed passing through the metallic plate in the moving direction of the moving contact part. When pressing the key-top to deform the elastic spring member, the air in the elastic spring member is discharged toward the lower side of the metallic plate through the hole and the air-passage hole. The hole and the air-passage hole are independently formed by punching by a press or the like, thereby facilitating the manufacturing of the keyboard input device.

With this arrangement, a CPU (central processing unit) which generates heat is cooled with the air discharged toward the lower part of the metallic plate, when the CPU is disposed below the air-passage holes, thereby preventing a temperature increase in a notebook personal computer, etc., provided with the keyboard input device according to the present invention.

An insulating overcoat which is moisture-resistant and water-repellent is provided on the film substrate including the conducting patterns with the pairs of the fixed contact parts being exposed, and the elastic spring members are bonded to the overcoat by an adhesive, whereby a portion of the conducting patterns disposed outside the elastic spring members is protected from corrosion by the overcoat.

When the holes in the film substrate and the air-passage holes in the metallic plate, which are disposed in the same positions, are formed in one punching operation, the time required for shaping the holes and the air-passage holes can be reduced, and the holes and the air-passage holes can be formed exactly in the same positions.

What is claimed is:

1. A keyboard input device comprising:

a flexible film substrate;

a conducting pattern provided on said film substrate, including a pair of fixed contact parts opposing each other;

a hollow domed elastic spring member including a movable contact part provided on the ceiling thereof, the movable contact part being vertically movable; and a key-top for depressing the top of said elastic spring member;

wherein said elastic spring member is mounted on said film substrate so that said movable contact part is disposed over the pair of said fixed contact parts, an air-passage hole is provided in said ceiling having said movable contact part, the air-passage hole being formed in the vertically moving direction of said movable contact part, and air-passage grooves communicating with said air-passage hole are formed in a direction perpendicular to the axis of said air-passage hole, the air-passage grooves being provided at least in one of the positions in said key-top at a portion thereof to be in contact with the top of said elastic spring member and in said elastic spring member at the top thereof, whereby the air in the hollow elastic spring member is discharged, when said key-top is pressed to deform said elastic spring member, to the outside of said elastic spring member through said air-passage hole and said air-passage grooves.

2. A keyboard input device according to claim 1, wherein an insulating overcoat which is moisture-resistant and water-repellent is disposed on said film substrate including said conducting pattern with the pair of said fixed contact parts being exposed, and said elastic spring member is bonded to said overcoat by an adhesive.

3. A keyboard input device according to claim 1, wherein said film substrate is provided with a hole between the pair of said fixed contact parts, the pair of the fixed contact parts opposing each other across the hole therebetween.

* * * * *